US007989793B2

(12) United States Patent
Lee et al.

(10) Patent No.: US 7,989,793 B2
(45) Date of Patent: Aug. 2, 2011

(54) ELECTRICAL DEVICE USING PHASE CHANGE MATERIAL, PHASE CHANGE MEMORY DEVICE USING SOLID STATE REACTION AND METHOD FOR FABRICATING THE SAME

(75) Inventors: Seung Yun Lee, Daejeon (KR); Young Sam Park, Daejeon (KR); Sung Min Yoon, Daejeon (KR); Soon Won Jung, Chungcheongbuk-do (KR); Byoung Gon Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 160 days.

(21) Appl. No.: 12/326,776

(22) Filed: Dec. 2, 2008

(65) Prior Publication Data
US 2009/0146128 A1 Jun. 11, 2009

(30) Foreign Application Priority Data

Dec. 10, 2007 (KR) .................. 10-2007-0127534
Aug. 28, 2008 (KR) .................. 10-2008-0084534

(51) Int. Cl.
*H01L 29/02* (2006.01)
(52) U.S. Cl. ..................... 257/2; 257/E45.002
(58) Field of Classification Search ................. 257/2, 3, 257/4, 5, E45.002, 246, 248, 616; 365/163
See application file for complete search history.

(56) References Cited

U.S. PATENT DOCUMENTS

| 6,518,156 | B1 | 2/2003 | Chen et al. | |
|---|---|---|---|---|
| 6,727,192 | B2 | 4/2004 | Moore et al. | |
| 6,998,697 | B2 | 2/2006 | Campbell et al. | |
| 7,220,983 | B2 | 5/2007 | Lung | |
| 7,235,419 | B2 | 6/2007 | Harshfield et al. | |
| 2007/0034849 | A1* | 2/2007 | Sandoval et al. | 257/2 |
| 2007/0034850 | A1* | 2/2007 | Kostylev et al. | 257/4 |

FOREIGN PATENT DOCUMENTS

KR 1020070047724 A 5/2007

OTHER PUBLICATIONS

F.Pellizzer et al., "Novel μ Trench Phase-Change Memory Cell for Embedded and Stand-Alone Non-Volatile Memory Applications," 2004 Symposium on VLSI Technology Digest of Technical Papers, pp. 18-19, IEEE.
Tyler A. Lowrey et al., "Characteristics of OUM Phase Change Materials and Devices for High Density Nonvolatile Commodity and Embedded Memory Applications," Mat. Res. Soc. Symp. Proc. vol. 803, 2004 Materials Research Society.

* cited by examiner

*Primary Examiner* — Thomas L Dickey
*Assistant Examiner* — Nikolay Yushin

(57) ABSTRACT

Provided are a nonvolatile memory device and a method of fabricating the same, in which a phase-change layer is formed using a solid-state reaction to reduce a programmable volume, thereby lessening power consumption. The device includes a first reactant layer, a second reactant layer formed on the first reactant layer, and a phase-change layer formed between the first and second reactant layers due to a solid-state reaction between a material forming the first reactant layer and a material forming the second reactant layer. The phase-change memory device consumes low power and operates at high speed.

12 Claims, 8 Drawing Sheets

ELECTRICAL DEVICE USING PHASE CHANGE MATERIAL, PHASE CHANGE MEMORY DEVICE USING SOLID STATE REACTION AND METHOD FOR FABRICATING THE SAME

CROSS-REFERENCE TO RELATED APPLICATION

This application claims priority to and the benefit of Korean Patent Application Nos. 2007-0127534, filed Dec. 10, 2007 and 2008-0084534, filed Aug. 28, 2008, the disclosure of which is incorporated herein by reference in its entirety.

BACKGROUND

1. Field of the Invention

The present invention relates to a nonvolatile memory device and, more specifically, to a phase-change memory device, which is phase-changed according to an applied voltage or applied current, and a method of fabricating the same.

2. Discussion of Related Art

In general, some of materials formed of elements of Groups 14 to 16 have phase-change characteristics sensitive to light or a current pulse. Chalcogenides, which are formed of chalcogens such as sulfur (S), selenium (Se), and tellurium (Te), are typical examples of phase-change materials, and it is known that germanium antimony (GeSb) and zinc antimony (ZnSb) exhibit phase-change behaviors.

A phase-change material has a crystalline phase and an amorphous phase according to a crystalline structure. Since the optical reflectance and electrical resistance of the phase-change material depend on the phase thereof, the phase-change material may be used to fabricate an optical storage medium or a nonvolatile memory device.

Optical disks, such as digital versatile disk rewritables (DVD-RWs) and digital versatile disk-random access memories (DVD-RAMs), which are based on the optical properties of phase-change materials, have already been put to practical use. In addition, a vast amount of research has been conducted on putting nonvolatile memory devices using electrical properties of phase-change materials to practical use.

A nonvolatile memory device makes use of a difference in resistivity of a phase-change material between an amorphous phase and a crystalline phase. The phase change of the phase-change material is induced by the application of a current pulse. The amplitude and duration of a current pulse applied to the nonvolatile memory during a SET transition in which an amorphous phase is switched to a crystalline phase are different from those of a current pulse applied to the nonvolatile memory device during a RESET transition in which the crystalline phase is switched to the amorphous phase.

Since it is only necessary to heat the phase-change material to a crystallization temperature or higher to enable the SET transition, the amplitude of a current pulse need not be so large. However, since some time is needed for crystallization, the application of the current pulse must be continued for a critical amount of time or longer.

In comparison, it is necessary to heat the phase-change material to a melting point or higher to enable the RESET transition. Accordingly, the amplitude of a current pulse must be even larger than for the SET transition, and a time taken to apply the current pulse must be reduced to be shorter than for the SET transition in order to inhibit the crystallization of the amorphous phase-change material.

A very large amplitude of a current pulse required to induce a RESET transition becomes a serious obstacle to the use of a phase-change memory device in practice. When a typical phase-change material layer formed of GeSbTe (GST) is used and a contact area between the GST phase-change material layer and a lower electrode is $0.5 \times 0.5$ μm$^2$, a current pulse of about several mA or more must be applied to enable a RESET transition. In order to reduce a RESET current, a method of changing a device structure or a method of adopting a new phase-change material or a new lower electrode material is being considered.

FIG. 1 is a cross-sectional view of a conventional memory device having a phase-change material. Referring to FIG. 1, the conventional phase-change memory device includes a lower electrode 106, a heating layer 108, a phase-change material 112, and an upper electrode 116.

When power is applied between the lower electrode 106 and the upper electrode 116 of the phase-change memory device, a portion of the phase-change material 112 is phase-changed. In this case, the phase-changed portion is referred to as a programmable volume 112a. As the programmable volume 112a of the phase-change memory device decreases, a current required for a SET or RESET transition decreases.

In order to reduce the programmable volume, a method of downsizing a contact hole which the phase-change material 112 contacts the heating layer 108 may be used. However, the method of downsizing the contact hole involves high-cost semiconductor process technologies.

Specifically, advanced photolithography and etching techniques are required to form sub-micron contact holes. Also, a deposition technique with good step coverage characteristics is required to fill the sub-micron contact holes.

Accordingly, it is necessary to develop a method of fabricating a phase-change memory device that does not require advanced process technologies or incur high fabrication costs.

SUMMARY OF THE INVENTION

The present invention is directed to a method of fabricating a phase-change memory device that does not require advanced process technologies or incur high costs.

Also, the present invention is directed to a method of fabricating a phase-change memory device in which a phase-change layer is formed using a solid-state reaction so that a programmable volume is reduced to lessen power consumption. The solid-state reaction means that the material of the first reactant layer and the material of the second reactant layer form compound through chemical reaction or mixture by mixing each other.

Additional aspects and/or advantages of the invention will be set forth in part in the description which follows and, in part, will be obvious from the description, or may be learned by practice of the invention.

One aspect of the present invention provides a phase-change memory device using a solid-state reaction. The electrical device using a phase-change material comprising, a first reactant layer, a second reactant layer formed on the first reactant layer, and a phase-change layer formed between the first and second reactant layers due to a solid-state reaction between a material forming the first reactant layer and a material forming the second reactant layer.

Another aspect of the present invention provides a method of fabricating a phase-change memory device using a solid-state reaction. The method includes: forming a first reactant layer on a substrate; forming an insulating layer covering the first reactant layer having a contact hole formed therein partially exposing a top surface of the first reactant layer; forming a second reactant layer on the first reactant layer;; and causing a solid-state reaction of a material forming the first reactant layer with a material forming the second reactant layer to form a phase-change layer between the first and second reactant layers.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein.

Figure 2:
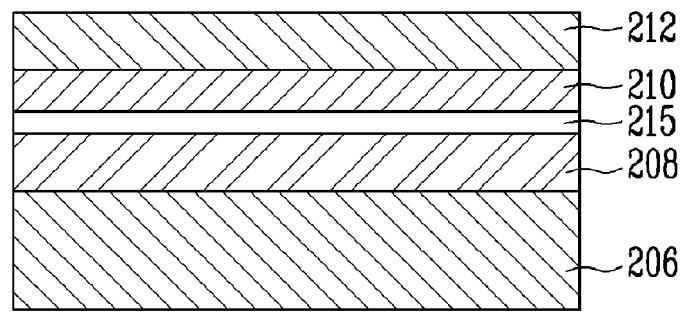
FIG. 2 is a cross-sectional view of an electrical device using a phase-change material according to an exemplary embodiment of the present invention.

FIG. 2 is a cross-sectional view of an electrical device using a phase-change material according to an exemplary embodiment of the present invention.

Referring to FIG. 2, the electrical device using a phase-change material includes a lower electrode 206, a first reactant layer 208, a second reactant layer 210, and an upper electrode 212, and a phase-change layer 215 formed using the solid-state reaction.

The lower electrode 206 may be formed on a substrate (non showing), and the first reactant layer 208 are sequentially stacked on the lower electrode 206.

When the lower electrode 206 is formed on the substrate, an insulating layer (non showing) such as an oxide layer and so on is formed between the lower electrode 206 and the substrate.

The lower and upper electrodes 206 and 212 may function as lower and upper terminals, respectively, of the phase-change memory device. The lower and upper electrodes 206 and 212 may be formed of a metal.

The first and second reactant layers 208 and 210 may be formed of elements between which a solid-state reaction occurs to generate a phase-change material.

Each of the first and second reactant layers 208 and 210 may be formed of one selected from the group consisting of silicon (Si), germanium (Ge), a chalcogen, and a combination thereof. For example, each of the first and second reactant layers 208 and 210 may have one stack structure selected from the group consisting of Ge/Sb, Sb/Ge, Ge/Te, Te/Ge, Sb/Te, Te/Sb, Ge/SbTe, SbTe/Ge, SiGe/SbTe, and SbTe/SiGe. In this case, GeSb, GeTe, SbTe, GeSbTe, or SiGeSbTe may be formed as a phase-change material.

The phase-change layer 215 is formed by a solid-state reaction between a material forming the first reactant layer 208 and a material forming the second reactant layer 210. The solid-state reaction is facilitated with the application of thermal energy. Thus, the phase-change layer 215 may be formed to a desired thickness by controlling annealing conditions.

Also, the thickness of the phase-change layer 215 is determined by the diffusivity of each of the materials forming the first and second reactant layers 208 and 210.

Also, the insulating layer may be formed between the first and second reactant layers 208 and 210, the first and second reactant layers 208 and 210 may be contacted through a contact hole formed on the insulating layer. And the sectional area of the phase-change layer 215 is limited to the area of a contact hole. The phase-change layer 215 is reversibly switched between amorphous and crystalline phases according to the amount of applied current.

The phase-change layer 215 formed due to the solid-state reaction has phase-change characteristics so that the memory device according to the present embodiment can operate as a phase-change memory device, transistor, switch and so on. Meanwhile, since a programmable volume cannot exceed the entire volume of the phase-change layer 215, as the volume of the phase-change layer 215 decreases, the programmable volume also decreases.

Accordingly, the electrical device using the phase-change memory according to the present embodiment can reduce the amount of current required for SET and RESET transitions.

Figure 3:
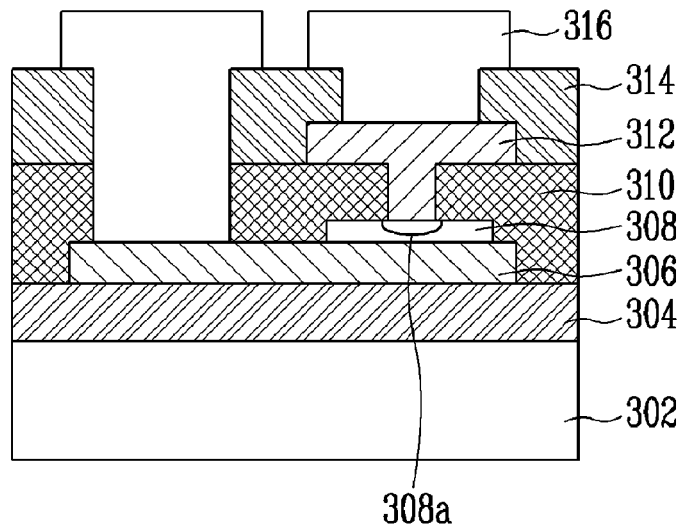
FIG. 3 is a cross-sectional view of a phase-change memory device using a solid-state reaction according to an exemplary embodiment of the present invention.

FIG. 3 is a cross-sectional view of a phase-change memory device using a solid-state reaction according to an exemplary embodiment of the present invention.

Referring to FIG. 3, the phase-change memory device using the solid-state reaction includes a substrate 302, a lower insulating layer 304, a lower electrode 306, a first reactant layer 308, an intermediate insulating layer 310, a second reactant layer 312, an upper insulating layer 314, an upper electrode 316, and a phase-change layer 308a formed using the solid-state reaction.

Construction of the phase-change memory device using the solid-state reaction according to the present embodiment will be described in detail with reference to FIG. 3.

The lower insulating layer 304, the lower electrode 306, and the first reactant layer 308 are sequentially stacked on the substrate 302.

In the present embodiment, the substrate 302 may be a silicon substrate. In this case, an upper portion of the substrate 302 may be thermally oxidized to form a $SiO_2$ layer. The $SiO_2$ layer may replace the lower insulating layer 304.

The lower and upper electrodes 306 and 316 may function as lower and upper terminals, respectively, of the phase-change memory device. The lower and upper electrodes 306 and 316 may be formed of a metal. Specifically, the lower and upper electrodes 306 and 316 may be formed of a highly electrically conductive material, for example, aluminum (Al), copper (Cu), platinum (Pt), tungsten (W), titanium tungsten (TiW), or polycrystalline silicon (poly-Si).

The first and second reactant layers 308 and 312 may be formed of elements between which a solid-state reaction occurs to generate a phase-change material.

Each of the first and second reactant layers 308 and 312 may be formed of one selected from the group consisting of silicon (Si), germanium (Ge), a chalcogen, and a combination thereof. For example, each of the first and second reactant layers 308 and 312 may have one stack structure selected from the group consisting of Ge/Sb, Sb/Ge, Ge/Te, Te/Ge, Sb/Te, Te/Sb, Ge/SbTe, SbTe/Ge, SiGe/SbTe, and SbTe/SiGe. In this case, GeSb, GeTe, SbTe, GeSbTe, or SiGeSbTe may be formed as a phase-change material.

The phase-change layer 308a is formed by a solid-state reaction between a material forming the first reactant layer 308 and a material forming the second reactant layer 312. The solid-state reaction is facilitated with the application of thermal energy. Thus, the phase-change layer 308a may be formed to a desired thickness by controlling annealing conditions.

Also, the thickness of the phase-change layer 308a is determined by the diffusivity of each of the materials forming the first and second reactant layers 308 and 312, and the sectional area of the phase-change layer 308 is limited to the area of a contact hole. The phase-change layer 308a is reversibly switched between amorphous and crystalline phases according to the amount of applied current.

The phase-change layer 308a formed due to the solid-state reaction has phase-change characteristics so that the memory device according to the present embodiment can operate as a phase-change memory device. Meanwhile, since a programmable volume cannot exceed the entire volume of the phase-change layer 308a, as the volume of the phase-change layer 308a decreases, the programmable volume also decreases.

Accordingly, the phase-change memory device using the solid-state reaction according to the present embodiment can reduce the amount of current required for SET and RESET transitions.

FIGS. 4A through 4F are cross-sectional views illustrating a method of fabricating a phase-change memory device using a solid-state reaction according to an exemplary embodiment of the present invention.

Hereinafter, a method of fabricating a phase-change memory device using a solid-state reaction according to the present embodiment will be described in detail with reference to FIGS. 4A through 4F.

Figure 4A:
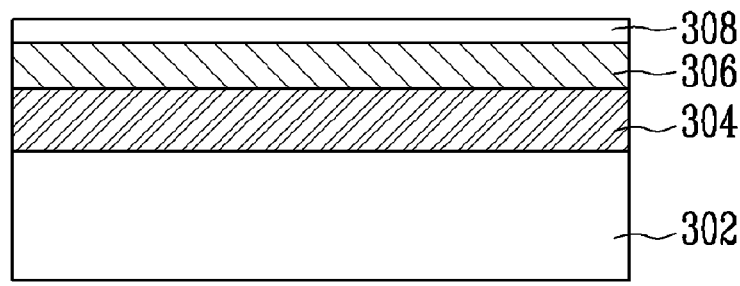
FIGS. 4A through 4F are cross-sectional views illustrating a method of fabricating a phase-change memory device according to an exemplary embodiment of the present invention.

Referring to FIG. 4A, a lower insulating layer 304, a lower electrode 306, and a first reactant layer 308 are sequentially stacked on a substrate 302.

When the substrate 302 is a silicon substrate, an upper portion of the substrate 302 may be thermally oxidized to form a $SiO_2$ layer. Since the $SiO_2$ layer functions as the lower insulating layer 304, it is unnecessary to additionally form the lower insulating layer 304.

The lower electrode 306 is formed of a highly electrically conductive material, such as TiW, poly-Si, or Al.

The first reactant layer 308 may be one selected from the group consisting of silicon (Si), germanium (Ge), antimony (Sb), a chalcogen, and a combination thereof. For example, the first reactant layer 308 may be obtained by depositing a layer formed of silicon (Si), germanium (Ge), antimony (Sb), selenium (Se), tellurium (Te), antimony tellurium (SbTe), or silicon germanium (SiGe). The deposition of the first reactant layer 308 may be performed using a sputtering process. When the first reactant layer 308 is formed by depositing a Ge layer, the Ge layer may be deposited to a thickness of about 1 to 200 nm.

Figure 4B:
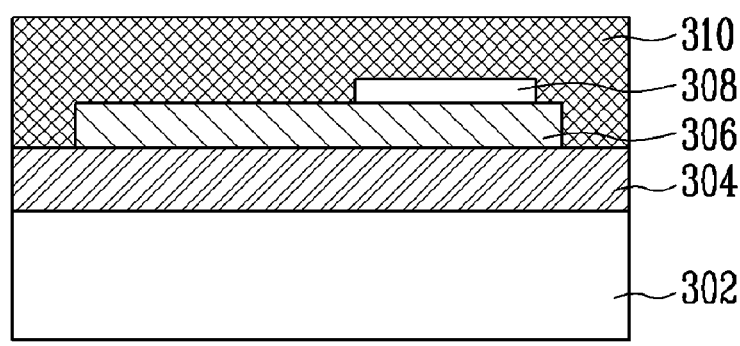

Referring to FIG. 4B, the lower electrode 306 and the first reactant layer 308 may be patterned, and an intermediate insulating layer 310 may be stacked.

The patterning of the lower electrode 306 and the first reactant layer 308 may be performed using photolithography and dry etching processes.

Figure 4C:
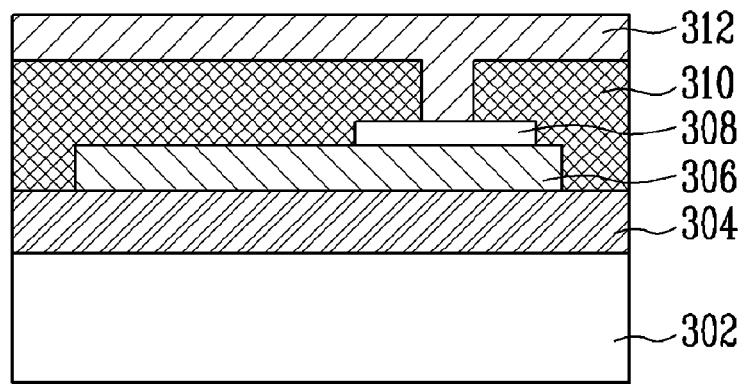

Referring to FIG. 4C, the intermediate insulating layer 310 is patterned, thereby forming a contact hole partially exposing a top surface of the first reactant layer 308. Thereafter, a second reactant layer 312 is formed filling the contact hole.

The patterning of the intermediate insulating layer 310 may be performed using photolithography and dry etching processes.

When the first reactant layer 308 is formed of Ge, the second reactant layer 312 may be formed of Sb or SbTe. When the first reactant layer 308 is formed of Sb or SbTe, the second reactant layer 312 may be formed of Ge. When the first reactant layer 308 is formed of Ge, the second reactant layer 312 may be formed of Te. When the first reactant layer 308 is formed of Te, the second reactant layer 312 may be formed of Ge. When the first reactant layer 308 is formed of Sb, the second reactant layer 312 may be formed of Te. When the first reactant layer 308 is formed of Te, the second reactant layer 312 may be formed of Sb.

When the first reactant layer 308 is formed of SiGe, the second reactant layer 312 may be formed of SbTe. When the first reactant layer 308 is formed of SbTe, the second reactant layer 312 may be formed of SiGe. The second reactant layer 312 may be deposited using a sputtering process.

When the second reactant layer 312 is formed by depositing an Sb layer, the Sb layer may be formed to a thickness of about 1 to 300 nm.

Figure 4D:
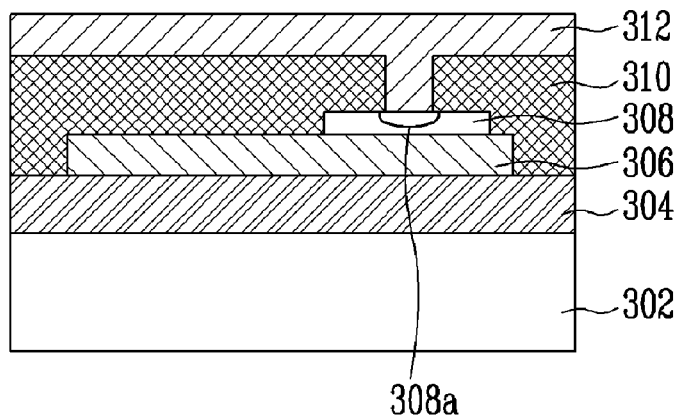
Figure 4E:
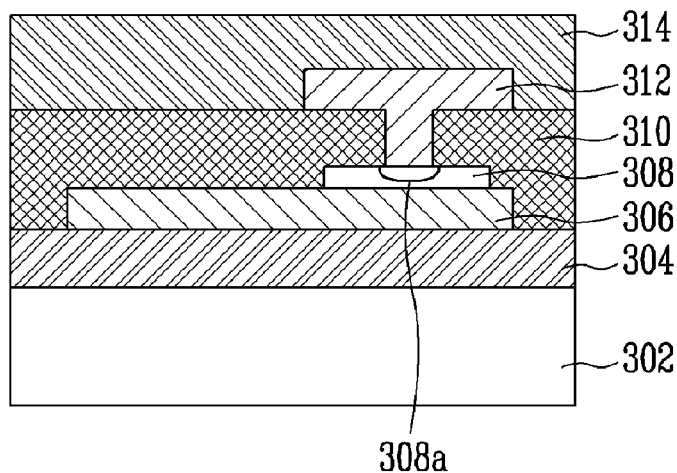

Thereafter, thermal energy is applied to the resultant structure having the second reactant layer 312, for example, using an annealing process, thereby forming a phase-change layer 308a as shown in FIG. 4D.

More specifically, when thermal energy is applied to the resultant structure in which the first and second reactant layer 308 and 312 are stacked, a solid-state reaction occurs between materials forming the first and second reactant layers 308 and 312, thus generating the phase-change layer 308a.

Meanwhile, the annealing process required for the solid-state reaction may not be required in the present process step. In other words, after the first and second reactant layers 308 and 312 are deposited, the annealing process required for the solid-state reaction may be performed during any subsequent process step.

The annealing process may be performed at a temperature of about 100 to 600□. When the annealing process is performed at temperatures below 100□ or above 600□, expected device characteristics due to the solid-state reaction cannot be obtained. The device characteristics of the phase-change memory device according to an annealing temperature will be described with reference to FIGS. 5 to 7.

Figure 5:
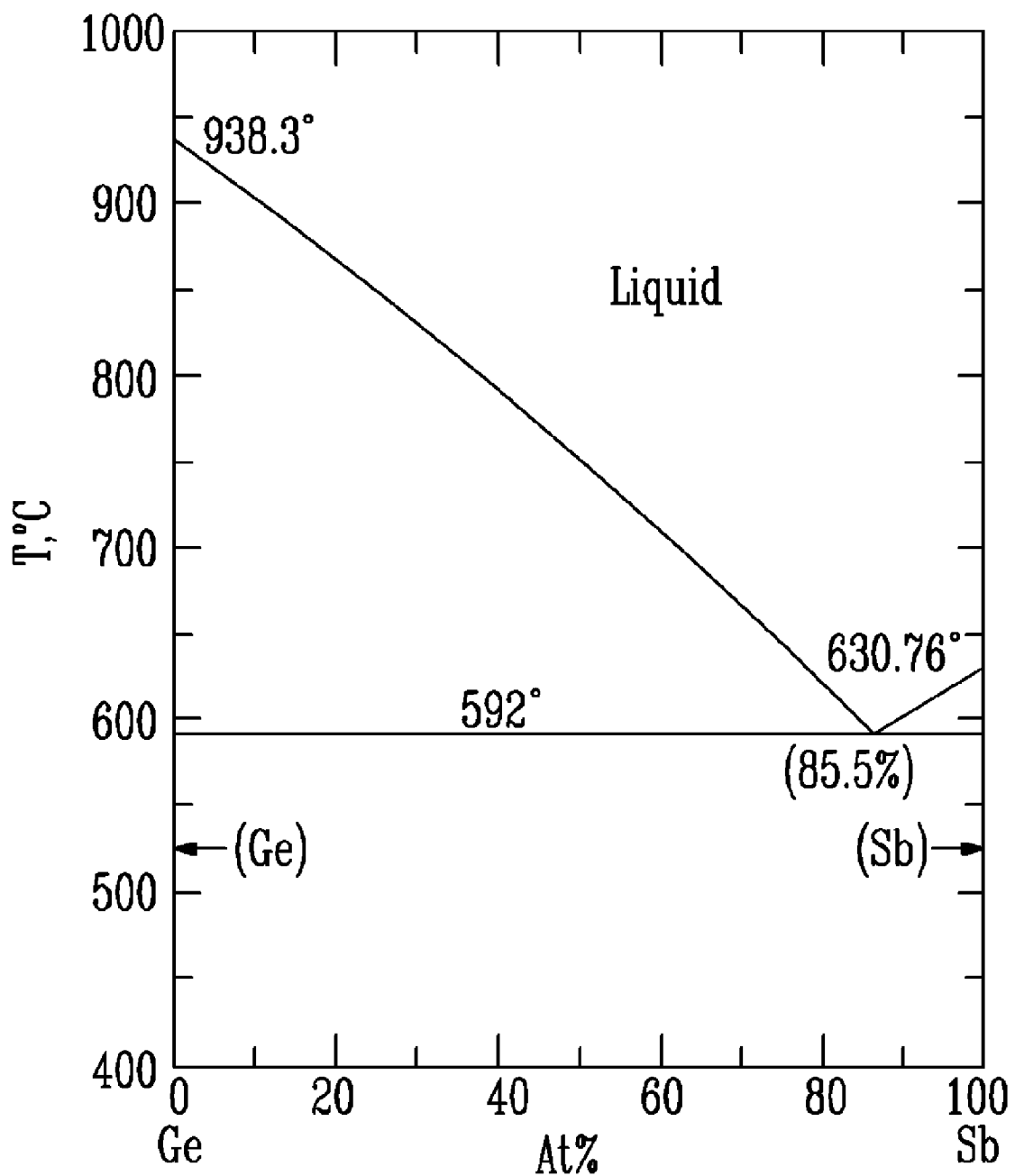
FIG. 5 is a phase diagram of germanium-antimony (Ge—Sb)

FIG. 5 is a phase of Ge—Sb.

Referring to FIG. 5, it can be seen that a $Ge_xSb_{1-x}$ solid solution was formed in all compositions of Ge and Sb. Also, when the concentration of Sb was 85.5 atomic %, a GeSb alloy formed a eutectic mixture at a eutectic point of about 592° C.

Figure 6:
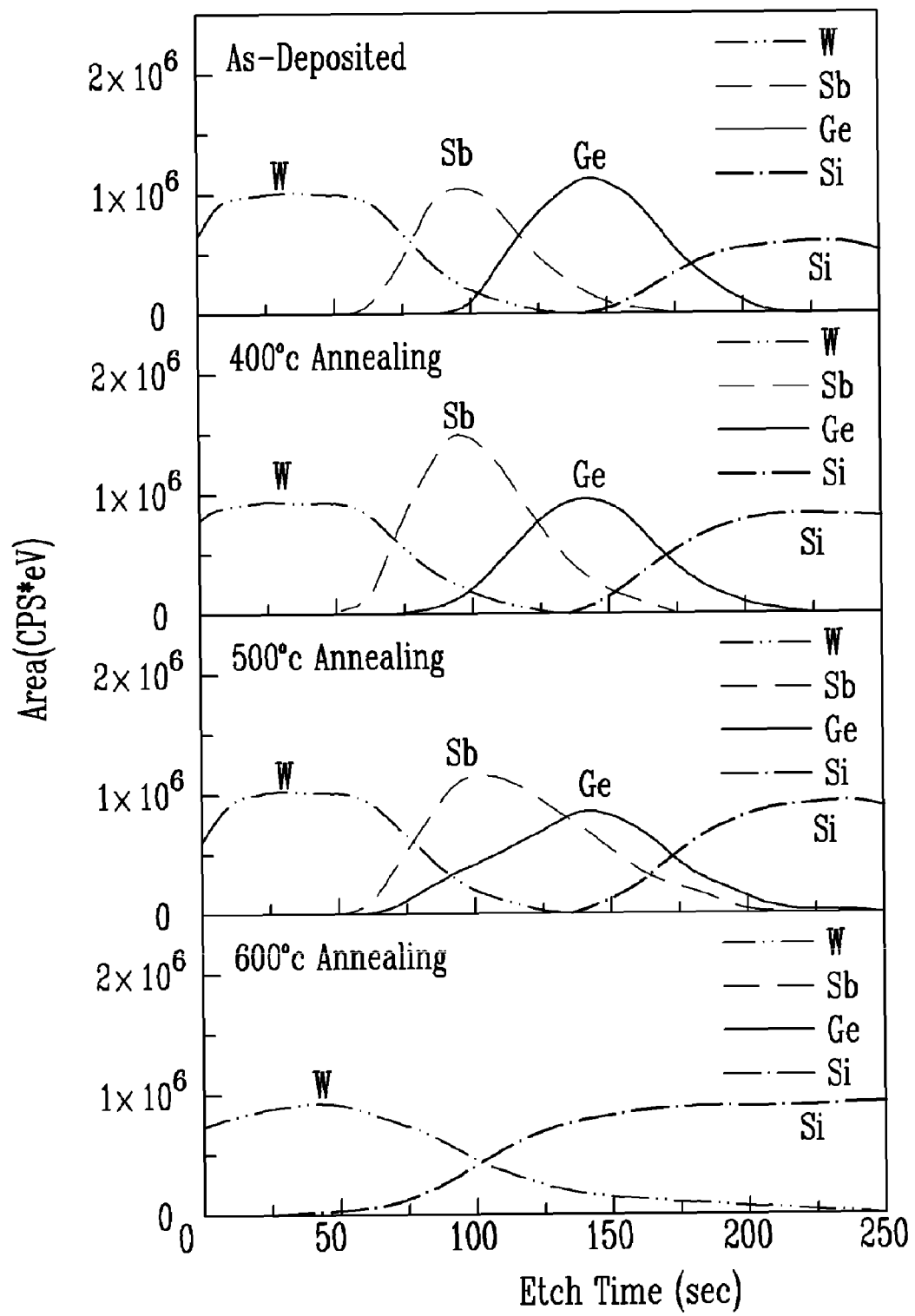
FIG. 6 is a graph showing results of Auger electron spectroscopy (AES) analysis, which shows the concentration of each element relative to the depth of a sample of a W/Sb/Ge/Si multiple layer after the W/Sb/Ge/Si multiple layer was annealed.

FIG. 6 is a graph showing results of Auger electron spectroscopy (AES) analysis, which shows the concentration of each element relative to the depth of a sample of a W/Sb/Ge/

Figure 7:
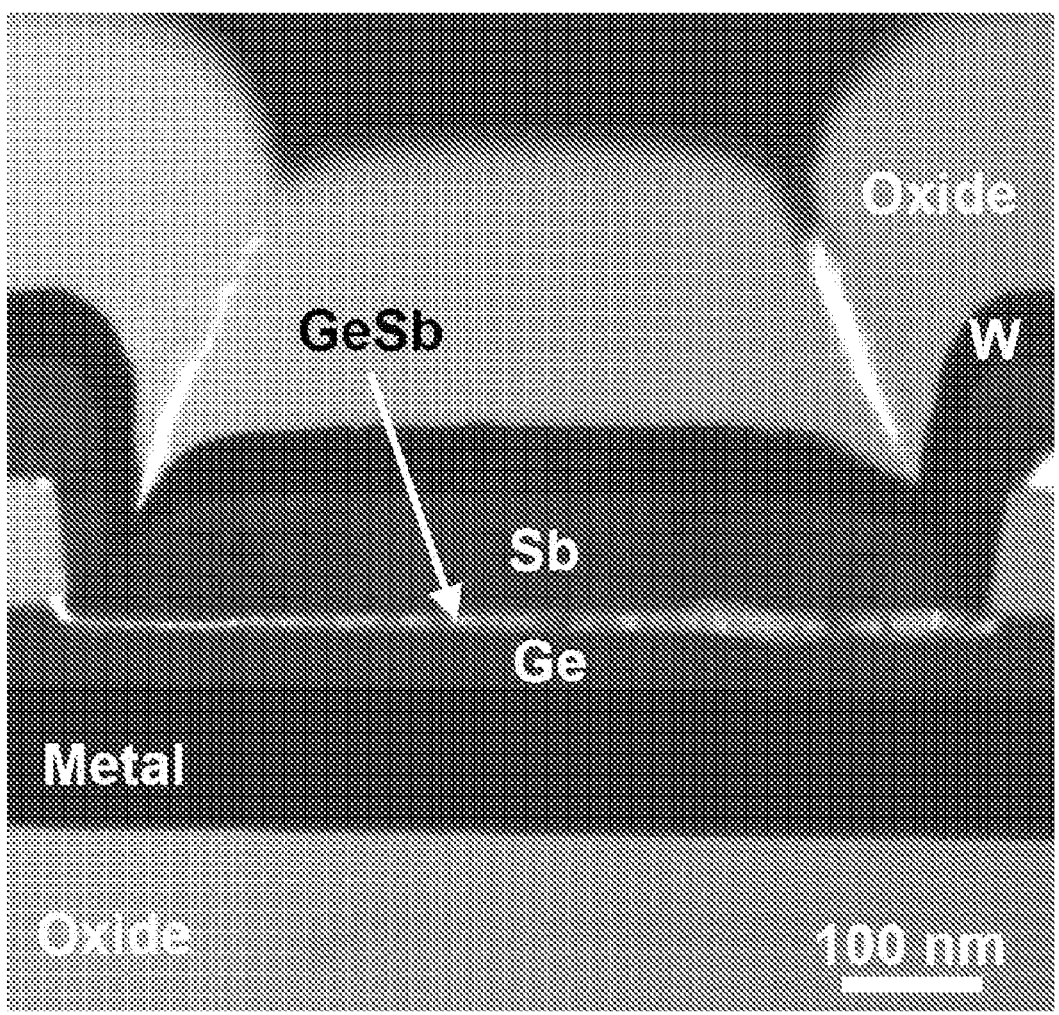
FIG. 7 is a transmission electron microscopy (TEM) image showing a state of germanium-antimony (Ge—Sb)

Si multiple layer after the W/Sb/Ge/Si multiple layer was annealed and FIG. 7 is a TEM image showing a state of germanium-antimony (Ge—Sb).

The sample of the W/Sb/Ge/Si multiple layer was a W (50 nm)/Sb (100 nm)/Ge (100 nm)/Si wafer. The sample was annealed for 1 hour in a $N_2$ atmosphere.

Referring to FIG. 6, when an annealing temperature increased from 400☐ to 500☐, Sb was sufficiently mixed with Ge forming a GeSb alloy.

Meanwhile, Sb and Ge elements were not observed in the sample at an annealing temperature of about 600☐. This is because the annealing temperature exceeded the eutectic point (592☐) of GeSb that is described above with reference to FIG. 5.

Accordingly, in order to cause the solid-state reaction to fabricate the phase-change memory device according to the exemplary embodiment of the present invention, the resultant structure having the first and second reactant layer 208 and 212 may be annealed at a temperature of about 100 to 600☐. The annealing temperature is not limited to the solid-state reaction between Sb and Ge and may be also applied to a solid-state reaction between two selected from the group consisting of Si, Ge, Sb, Se, Te, SbTe, and SiGe.

Referring to FIG. 7, the lower electrode, the first reactant layer, the second reactant layer, the upper electrode, and the oxide are sequentially stacked on the oxide.

When the first reactant layer is formed by Ge, the second reactant layer is formed by Sb, and annealing is proceeded for inducing the solid state reaction, GeSb is formed between the first reactant layer and the second reactant layer as the phase-change layer.

Referring again to FIG. 4E, after the phase-change layer 308a is formed, the second reactant layer 312 is patterned, and an upper insulating layer 314 is formed.

The patterning of the second reactant layer 312 may be performing using photolithography and dry etching processes.

Meanwhile, the second reactant layer 312 need not be patterned. In this case, after the phase-change layer 308a is formed due to the solid-state reaction, the second reactant layer 312 need not be patterned but may be completely removed using a wet etching process, thereby fabricating the phase-change memory device.

Figure 4F:
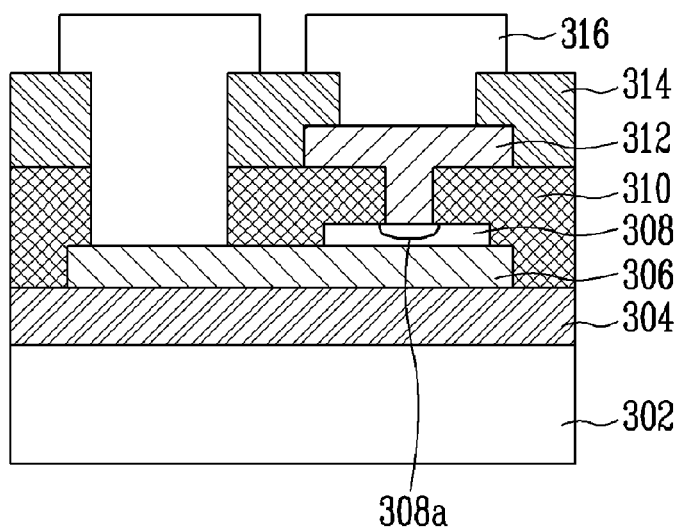

Referring to FIG. 4F, the upper insulating layer 314 may be patterned to form a via hole partially exposing a top surface of the second reactant layer 312. An upper electrode 316 is formed filling the via hole, and then patterned.

The patterning of the upper insulating layer 314 and the upper electrode 316 may be performed using photolithography and dry etching processes.

The upper electrode 316 may be formed of a highly electrically conductive material, such as Cu, TiW, poly-Si, or Al.

Characteristics of the phase-change memory device fabricated using the above-described processes will now be described with reference to FIGS. 8 and 9.

Figure 8:
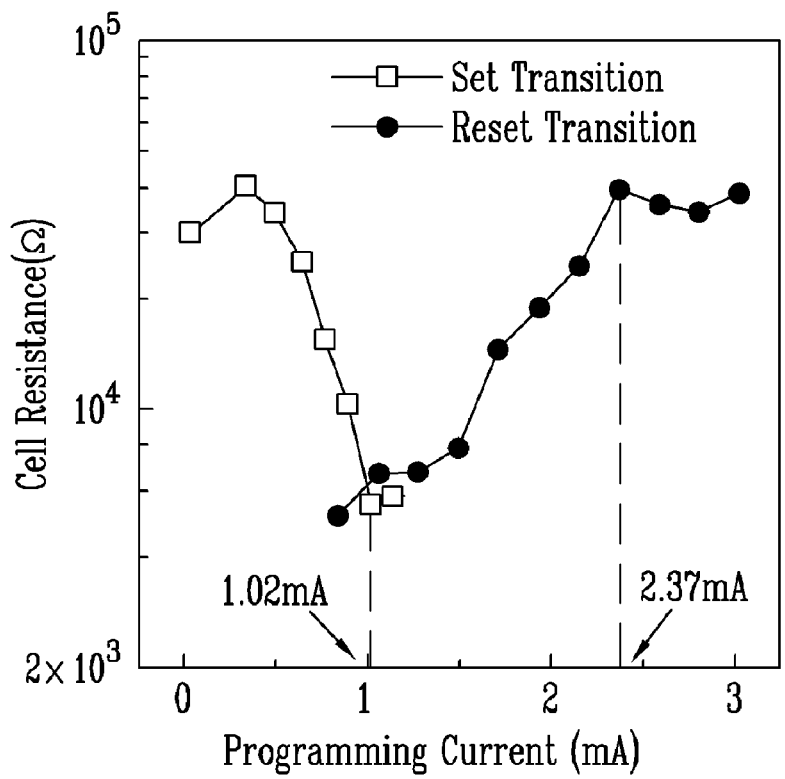
FIG. 8 is a graph showing cell resistance relative to a program current in a conventional phase-change memory device.

FIG. 8 is a graph showing cell resistance relative to a programming current in a conventional phase-change memory device.

Figure 1:
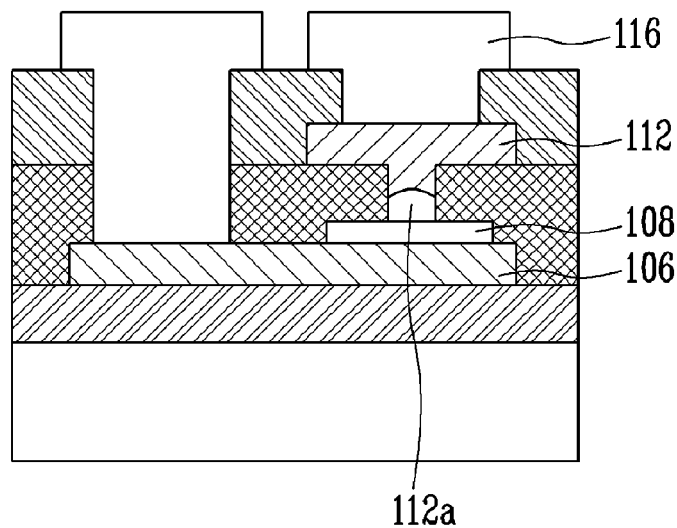
FIG. 1 is a cross-sectional view of a conventional memory device having a phase-change material.

A test device had the same structure as shown in FIG. 1. A phase-change layer was formed of a GeSb alloy that formed a eutectic mixture, and a heating layer was formed of a SiGe alloy. Referring to FIG. 8, a SET current and a RESET current are about 1.02 mA and 2.37 mA, respectively, and a ratio of a RESET resistance to a SET resistance is about 7:1.

Figure 9:
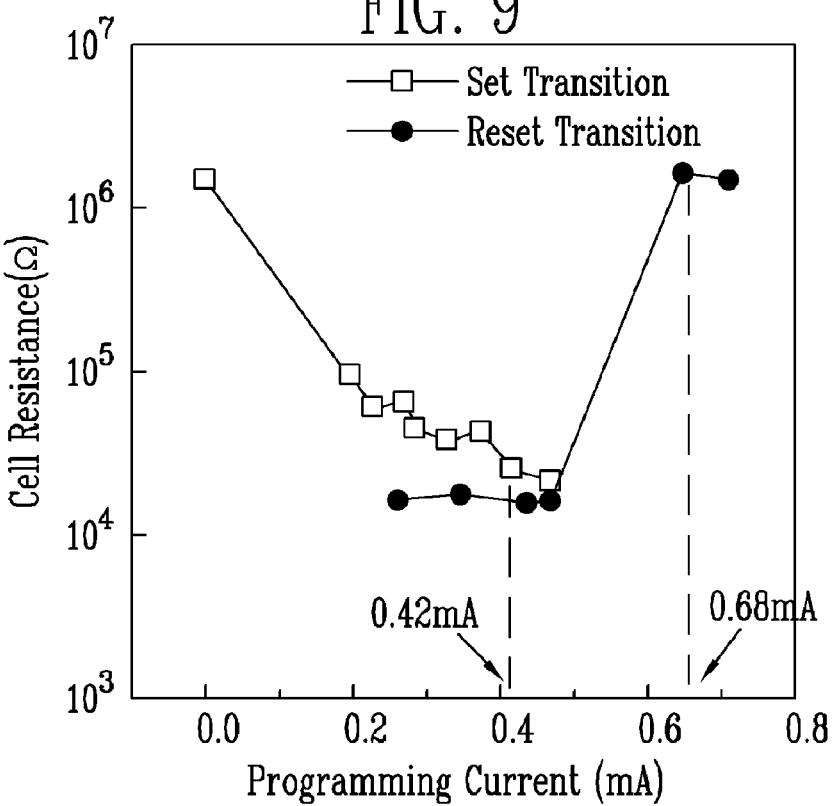
FIG. 9 is a graph showing cell resistance relative to a program current in a phase-change memory device fabricated using a solid-state reaction according to an exemplary embodiment of the present invention.

FIG. 9 is a graph showing cell resistance relative to a programming current in a phase-change memory device using a solid-state reaction according to an exemplary embodiment of the present invention.

Referring to FIG. 9, in the phase-change memory device using the solid-state reaction according to the embodiment of the present invention, a SET current and a RESET current are about 0.42 mA and 0.68 mA, respectively, which are only about 41% and 29% of the SET and RESET currents of the conventional structure shown in FIG. 8.

The SET and RESET currents of the phase-change memory device using the solid-state reaction are smaller than those of the conventional memory device because the phase-change layer 308a of the phase-change memory device using the solid-state reaction has a small volume. In other words, the phase-change memory device using the solid-state reaction has a small programmable volume.

Also, in the phase-change memory device using the solid-state reaction according to the present embodiment, a ratio of a RESET resistance to a SET resistance is about 100:1, which is about 14 times as high as in the conventional memory device. The phase-change memory device according to the present embodiment has such a high resistivity because a large portion of the phase-change layer 308a formed due to the solid-state reaction participates in phase change, thereby improving the device characteristics of the phase-change memory device.

According to the present invention as described above, a phase-change layer having a small volume is formed using a solid-state reaction between two adjacent materials so that a programmable volume is reduced to lessen power consumption.

Also, since the phase-change memory device according to the present invention requires low power during phase change, the amplitude and duration of a current pulse applied to the phase-change memory device are reduced, thereby increasing an operating speed.

Figure 10:
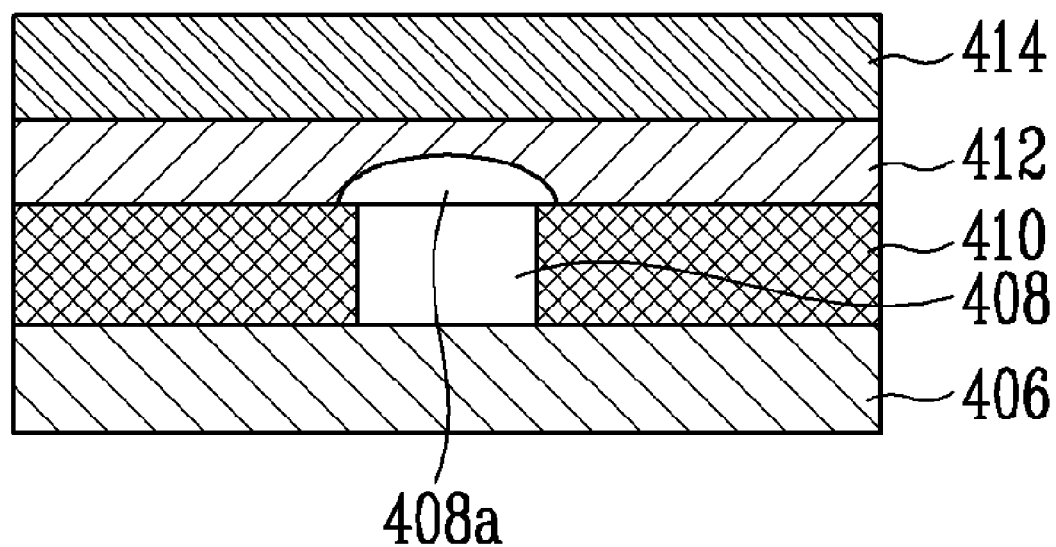
FIG. 10 is a cross-sectional view of a phase-change memory device using a solid-state reaction according to a secondary embodiment of the present invention.

FIG. 10 is a cross-sectional view of a phase-change memory device according to a secondary embodiment of the present invention.

The structure of FIG. 10 is different from the structure of FIG. 3 as the first reactant layer 408 has small sectional area surrounding the insulating layer 410 and the first reactant layer 408 is formed below the second reactant layer 412.

Referring to FIG. 10, the insulating layer 410 is formed on the lower electrode 406, and the contact hole is formed.

The lower electrode 406 may be formed on a substrate (non showing), and the contact hole may be formed by at least partially exposing the lower electrode 406.

Next, the first reactant layer 408 is formed by filling the contact hole. The first reactant layer 408 may be formed by depositing the first reactant layer 408 such that the material of the first reactant layer 408 fills the contact hole, and then through chemical mechanical polishing (CMP), the upper side of the first reactant layer 408 and the upper side of the insulating layer 410 may essentially be on the same plane.

The second reactant layer 412 is formed on the first reactant layer 408, and the phase-change layer 408a is formed by a solid-state reaction between a material forming the first reactant layer 408 and a material forming the second reactant layer 412. The solid-state reaction is facilitated with the application of thermal energy.

The upper electrode 414 is formed thereon.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. An electrical device using a phase-change material comprising:
   a first reactant layer, the first reactant layer being a first pre-cursor of phase-change material;
   a second reactant layer formed on the first reactant layer, the second reactant layer being a second pre-cursor of the phase-change material; and
   a phase-change layer formed of the phase-change material which is formed between the first and second reactant layers due to a solid-state reaction between a portion of the first reactant layer and a portion of the second reactant layer,
   wherein each of the first and the second reactant layers alone cannot function as phase-change material.

2. The device according to claim 1, wherein the phase-change layer is formed of a material that is reversibly switched between crystalline and amorphous phases according to the amount of applied current.

3. The device according to claim 1, wherein at least one of the first and second reactant layers is formed of one selected from the group consisting of silicon (Si), germanium (Ge), antimony (Sb), and a chalcogen.

4. The device according to claim 3, wherein a stack structure of the first and second reactant layers is selected from the group consisting of Ge/Sb, Sb/Ge, Ge/Te, Te/Ge, Sb/Te, and Te/Sb.

5. A phase-change memory device comprising:
   a first reactant layer;
   an insulating layer covering the first reactant layer having a contact hole formed therein partially exposing a top surface of the first reactant layer; and
   a second reactant layer filling the contact hole,
   wherein a phase-change layer is formed between the first and second reactant layers due to a solid-state reaction between a material forming the first reactant layer and a material forming the second reactant layer.

6. The device according to claim 5, wherein the phase-change layer is formed of a material that is reversibly switched between crystalline and amorphous phases according to the amount of applied current.

7. The device according to claim 5, wherein at least one of the first and second reactant layers is formed of one selected from the group consisting of silicon(Si), germanium(Ge), antimony (Sb), a chalcogen, and a combination thereof 8. The device according to claim 5, wherein each of the first and second reactant layers has one stack structure selected from the group consisting of Ge/Sb, Sb/Ge, Ge/Te, Te/Ge, Sb/Te, Te/Sb, Ge/SbTe, SbTe/Ge, SiGe/SbTe, and SbTe/SiGe.

9. A phase-change memory device comprising:
   an insulating layer formed over a lower electrode, and having a contact hole partially exposing the lower electrode;
   a first reactant layer filling the contact hole, the first reactant layer being formed of a first pre-cursor of phase-change material;
   a second reactant layer formed over the first reactant layer, the second reactant layer being formed of a second pre-cursor of the phase-change material; and
   a phase-change layer formed of the phase-change material which is formed between the first and second reactant layers due to a solid-state reaction between the first cursor forming of the first reactant layer and the second cursor forming of the second reactant layer,
   wherein each of the first and the second reactant layers alone cannot function as phase-change material.

10. The device according to claim 9, wherein the phase-change layer is formed of a material that is reversibly switched between crystalline and amorphous phases.

11. The device according to claim 10, wherein at least one of the first and second reactant layers is formed of one selected from the group consisting of silicon (Si), germanium (Ge), antimony (Sb), and a chalcogen.

12. The device according to claim 11, wherein a stack of the first and second reactant layers is selected from the group consisting of Ge/Sb, Sb/Ge, Ge/Te, Te/Ge, Sb/Te, and Te/Sb.

* * * * *